(12) United States Patent
Cheng et al.

(10) Patent No.: US 8,987,587 B2
(45) Date of Patent: Mar. 24, 2015

(54) METAL BARRIER-DOPED METAL CONTACT LAYER

(75) Inventors: Long Cheng, Perrysburg, OH (US); Akhlesh Gupta, Sylvania, OH (US); Anke Abken, Whitehouse, OH (US); Benyamin Buller, Sylvania, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/615,128

(22) Filed: Sep. 13, 2012

(65) Prior Publication Data

US 2013/0005075 A1      Jan. 3, 2013

Related U.S. Application Data

(62) Division of application No. 12/793,469, filed on Jun. 3, 2010.

(60) Provisional application No. 61/184,221, filed on Jun. 4, 2009.

(51) Int. Cl.
| H01L 31/00 | (2006.01) |
| H01L 21/00 | (2006.01) |
| H01L 31/0296 | (2006.01) |
| H01L 31/18 | (2006.01) |
| H01L 31/0224 | (2006.01) |
| H01L 31/073 | (2012.01) |

(52) U.S. Cl.
CPC ............ *H01L 31/0296* (2013.01); *H01L 31/18* (2013.01); *H01L 31/022425* (2013.01); *H01L 31/022466* (2013.01); *H01L 31/073* (2013.01); *H01L 31/1884* (2013.01); *Y02E 10/543* (2013.01)

USPC .............................................. 136/256; 438/98

(58) Field of Classification Search
CPC ........................................................ H01L 31/18
USPC .............................................. 136/256; 438/98
See application file for complete search history.

(56) References Cited

U.S. PATENT DOCUMENTS

| 3,725,309 A * | 4/1973 | Ames et al. ................... 428/614 |
| 4,826,777 A | 5/1989 | Ondris |
| 5,626,688 A | 5/1997 | Probst et al. |
| 5,922,142 A | 7/1999 | Wu et al. |
| 6,169,246 B1 | 1/2001 | Wu et al. |
| 6,784,361 B2 | 8/2004 | Carlson et al. |

(Continued)

FOREIGN PATENT DOCUMENTS

| CN | 1832207 A | 9/2006 |
| TW | 200631171 A | 9/2006 |
| WO | WO2008/026322 | 3/2008 |

OTHER PUBLICATIONS

Y. He et al., Diffusion barrier performances of direct current sputter-deposited Mo and MoxN films between Cu and Si, Journal of Crystal Growth 263 (2004) 203-207.*

(Continued)

*Primary Examiner* — James Lin
*Assistant Examiner* — Dujuan Horton
(74) *Attorney, Agent, or Firm* — Dickstein Shapiro LLP

(57) ABSTRACT

A photovoltaic device can include an intrinsic metal layer adjacent to a semiconductor absorber layer; and a doped metal contact layer adjacent to the intrinsic metal layer, where the doped metal contact layer includes a metal base material and a dopant.

9 Claims, 2 Drawing Sheets

(56) References Cited

U.S. PATENT DOCUMENTS

| | | |
|---|---|---|
| 7,390,961 B2 | 6/2008 | Aschenbrenner et al. |
| 2008/0053519 A1 | 3/2008 | Pearce et al. |
| 2008/0110498 A1* | 5/2008 | Zafar et al. .................... 136/260 |

OTHER PUBLICATIONS

Welsh, Valerie, "Work Function Engineering with Molybdenum and Molybdenum-Nitride Gate PMOS," 22nd Annual Microelectronic Engineering Conference, pp. 29-33, May 2004.

Mathew, Xavier et al., "CdTe/CdS Solar Cells on flexible Substrates," Science Direct; Solar Energy 77, pp: 831-838.

Raviendra, et al., "Electroless Deposition of Cadmium Stannate, Zinc Oxide, and Aluminum-Doped Zinc Oxide," Journal of Applied Physics, Jul. 15, 1985, vol. 58, No. 2, pp. 838-844.

Von Roedern, et al., "Material Requirements for Buffer Layers Used to Obtain Solar Cells with High Open Circuit Voltages," National Renewable Energy Laboratory, Material Research Society's Spring Meeting, San Francisco, CA, Apr. 6-10, 1999.

Scofield, et al., "Sputtered Molybdenum Bilayer Back Contact for Copper Indium Diselenide-Based Polycrystalline Thin-Film Solar Cells," Thin Solid Films, 260 (1), pp. 26-31, May 1, 1995.

Pudov, et al., "Effect of Back-Contact Copper Concentration on CdTe Cell Operation," Photovoltaic Specialists Conference 2002, Conference Record of the Twenty-Ninth IEEE, pp. 760-760, May 19-24, 2002.

Jenkins, et al., "CdTe Back Contact: Response to Copper Addition and Out-Diffusion," NCPV and Solar Program Review Meeting 2003.

He et al., Diffusion Barrier Performances of Direct Current Sputter-Deposited Mo and MoxN films between Cu and Si, Journal of Crystal Growth, 263 (2004) 203-207.

* cited by examiner

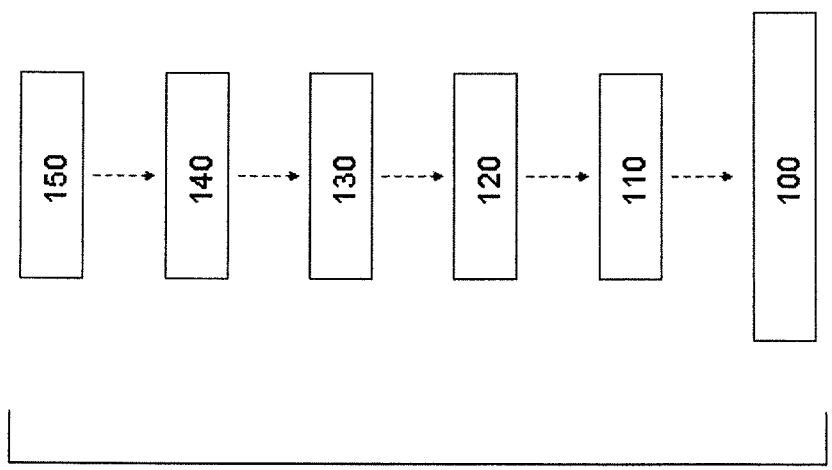

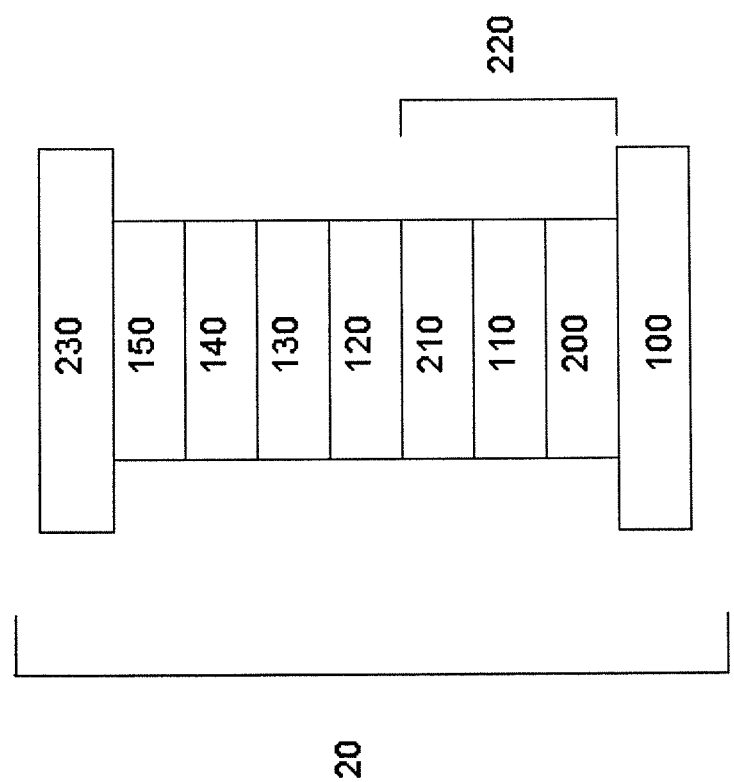

METAL BARRIER-DOPED METAL CONTACT LAYER

CLAIM FOR PRIORITY

This application is a divisional of U.S. patent application Ser. No. 12/793,469, filed on Jun. 3, 2010, which claims priority under 35 U.S.C. §119(e) to U.S. Provisional Patent Application Ser. No. 61/184,221 filed on Jun. 4, 2009, each of which is hereby incorporated by reference herein.

TECHNICAL FIELD

The present invention relates to photovoltaic devices and methods of production.

BACKGROUND

Photovoltaic devices can include semiconductor material deposited over a substrate, for example, with a first layer serving as a window layer and a second layer serving as an absorber layer. The semiconductor window layer can allow the penetration of solar radiation to the absorber layer, such as a cadmium telluride layer, which converts solar energy to electricity. Photovoltaic devices can also contain one or more transparent conductive oxide layers, which are also often conductors of electrical charge.

DESCRIPTION OF DRAWINGS

FIG. 1 is a schematic of a photovoltaic device having multiple layers.

FIG. 2 is a schematic of a photovoltaic device having multiple layers.

DETAILED DESCRIPTION

Photovoltaic devices can include multiple layers created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface.

Photovoltaic devices can include optically transparent substrates, such as glass. Because glass is not conductive, a transparent conductive oxide (TCO) layer can be deposited between the substrate and the semiconductor bi-layer to serve as a front contact. A metal layer can be deposited onto the p-type absorber layer to serve as a back contact. The front and back contacts can serve as electrodes for the device. A variety of materials are available for the metal layer, including, but not limited to molybdenum, aluminum, chromium, iron, nickel, titanium, vanadium, manganese, cobalt, zinc, ruthenium, tungsten, silver, gold, and platinum. Molybdenum functions particularly well as a back contact metal due to its relative stability at processing temperatures and low contact resistance. Copper has also proven effective for preserving fill factor. The inventions disclosed herein relate to the composition and deposition of back contacts for photovoltaic devices.

In one aspect, a photovoltaic device can include an intrinsic metal layer adjacent to a semiconductor absorber layer. The photovoltaic device can include a doped metal contact layer adjacent to the intrinsic metal layer. The doped metal contact layer can include a metal base material and a dopant. The intrinsic metal layer can include a molybdenum, aluminum, chromium, iron, nickel, titanium, vanadium, manganese, cobalt, zinc, ruthenium, tungsten, silver, gold, or platinum, or combinations thereof. The intrinsic metal layer can include a molybdenum. The intrinsic metal layer can include a nitrogen. The intrinsic metal layer can include a molybdenum nitride. The intrinsic metal layer can include a chromium. The metal base material can include a molybdenum, aluminum, chromium, iron, nickel, titanium, vanadium, manganese, cobalt, zinc, ruthenium, tungsten, silver, gold, or platinum, or combinations thereof. The metal base material can include a molybdenum. The dopant can include a copper, antimony, potassium, sodium, cesium, silver, gold, phosphorous, arsenic, and bismuth. The dopant can include a copper. The dopant can include a sodium. The doped metal contact layer can include a copper concentration of about 0.1% to about 10%. The photovoltaic device can include a semiconductor window layer, where the semiconductor absorber layer is positioned adjacent to the semiconductor window layer, and where the semiconductor window layer and the semiconductor absorber layer are at least a part of a semiconductor bi-layer. The semiconductor window layer can include a cadmium sulfide layer. The photovoltaic device can include a transparent conductive oxide stack, where the semiconductor bi-layer is positioned adjacent to the transparent conductive oxide stack. The photovoltaic device can include a first substrate, where the transparent conductive oxide stack is positioned adjacent to the first substrate. The first substrate can include a glass. The glass can include a soda-lime glass. The transparent conductive oxide stack can include a buffer layer positioned adjacent to a transparent conductive oxide layer, and where the transparent conductive oxide layer is positioned adjacent to one or more barrier layers. The transparent conductive oxide layer can include a cadmium stannate. The buffer layer can include a zinc tin oxide, tin oxide, zinc oxide, or zinc magnesium oxide, or combinations thereof. Each of the one or more barrier layers can include a silicon nitride, aluminum-doped silicon nitride, silicon oxide, aluminum-doped silicon oxide, boron-doped silicon nitride, phosphorous-doped silicon nitride, silicon oxide-nitride, or tin oxide, or combinations thereof. The photovoltaic device can include a back support adjacent to the doped metal contact layer.

In one aspect, a method for manufacturing a photovoltaic device can include depositing an intrinsic metal layer on a semiconductor absorber layer. The method can include depositing a doped metal contact layer on the intrinsic metal layer. The doped metal contact layer can include a metal base material and a dopant.

Depositing an intrinsic metal layer can include sputtering a molybdenum. Depositing an intrinsic metal layer can include sputtering a chromium. Depositing an intrinsic metal layer can include sputtering a molybdenum nitride. Depositing an intrinsic metal layer can include depositing a molybdenum, aluminum, chromium, iron, nickel, titanium, vanadium, manganese, cobalt, zinc, ruthenium, tungsten, silver, gold, or platinum, or combinations thereof. The method can include doping a metal base material to form a doped metal contact layer. The method can include doping a metal base material with a dopant, where the metal base material can include a molybdenum, aluminum, chromium, iron, nickel, titanium, vanadium, manganese, cobalt, zinc, ruthenium, tungsten, silver, gold, or platinum, or any combination thereof, and where the dopant can include a copper, antimony, potassium, sodium, cesium, silver, gold, phosphorous, arsenic, or bismuth, or any combination thereof. The method can include doping a metal base material with about 0.1% to about 10% copper. Depositing a doped metal contact layer can include sputtering a copper-doped molybdenum. Depositing a doped metal contact layer can include sputtering a metal base material that includes the same metal as the intrinsic metal layer. The method can include depositing the semiconductor absorber layer adjacent to a semiconductor window layer, where the semiconductor absorber layer includes a cadmium telluride layer, and where the semiconductor window layer includes a cadmium sulfide layer. The method can include depositing the semiconductor window layer adjacent to a transparent conductive oxide stack, where the transparent conductive oxide stack can include a buffer layer adjacent to a transparent conductive oxide layer, where the transparent conductive oxide layer is positioned adjacent to one or more barrier layers. The method can include depositing the transparent conductive oxide stack adjacent to a first substrate. The first substrate can include a glass. The glass can include a soda-lime glass. Each of the one or more barrier layers can include a silicon nitride, aluminum-doped silicon nitride, silicon oxide, aluminum-doped silicon oxide, boron-doped silicon nitride, phosphorous-doped silicon nitride, silicon oxide-nitride, or tin oxide, or combinations thereof. The transparent conductive oxide layer can include a cadmium stannate. The buffer layer can include a zinc tin oxide, tin oxide, zinc oxide, or zinc magnesium oxide, or combinations thereof. The method can include annealing the transparent conductive oxide stack. The method can include depositing a back support adjacent to the doped metal contact layer.

In one aspect, a photovoltaic module may include a plurality of photovoltaic cells adjacent to a substrate. The photovoltaic module may include a back cover adjacent to the plurality of photovoltaic cells. The plurality of photovoltaic cells may include a second metal layer adjacent to a first layer. The first layer may be positioned adjacent to a substrate. The second metal layer may include a dopant. The plurality of photovoltaic cells may include an intrinsic metal layer adjacent to a semiconductor absorber layer. The plurality of photovoltaic cells may include a doped metal contact layer adjacent to the intrinsic metal layer. The doped metal contact layer may include a metal base material and a dopant.

The photovoltaic module may include a first strip of tape having a length distributed along a contact region of each photovoltaic cell. The first strip of tape may include a front surface and a back surface. Each surface may contain an adhesive. The photovoltaic module may include a first lead foil distributed along the length of the first strip of tape. The photovoltaic module may include a second strip of tape, having a length shorter than that of the first strip of tape, distributed along the length and between the ends of the first strip of tape. The second strip of tape may include a front and back surface. Each surface may contain an adhesive. The photovoltaic module may include a second lead foil, having a length shorter than that of the second strip of tape, distributed along the length of the second strip of tape. The photovoltaic module may include a plurality of parallel bus bars, positioned adjacent and perpendicular to the first and second strips of tape. Each one of the plurality of parallel bus bars may contact one of the first or second lead foils. The photovoltaic module may include first and second submodules. The first submodule may include two or more cells of the plurality of photovoltaic cells connected in series. The second submodule may include another two or more cells of the plurality of photovoltaic cells connected in series. The first and second submodules may be connected in parallel through a shared cell.

In one aspect, a method for generating electricity may include illuminating a photovoltaic cell with a beam of light to generate a photocurrent. The method may include collecting the generated photocurrent. The photovoltaic cell may include a second metal layer adjacent to a first layer. The first layer may be positioned adjacent to a substrate. The second metal layer may include a dopant. The photovoltaic cell may include an intrinsic metal layer adjacent to a semiconductor absorber layer. The photovoltaic cell may include a doped metal contact layer adjacent to the intrinsic metal layer. The doped metal contact layer may include a metal base material and a dopant.

Referring to FIG. 1 by way of example, photovoltaic device 10 can be formed by depositing transparent conductive oxide layer 110 onto substrate 100 to serve as a front contact for photovoltaic device 10. Transparent conductive oxide layer 110 can include any suitable contact material, including a cadmium stannate, and can be deposited using any suitable technique, including sputtering. Semiconductor window layer 120 can be deposited on transparent conductive oxide layer 110. Semiconductor window layer 120 can include any suitable n-type semiconductor material, including cadmium sulfide. Semiconductor window layer 120 can be deposited using any suitable technique, including vapor transport. Semiconductor absorber layer 130 can be deposited onto semiconductor window layer 120. Semiconductor absorber layer 130 can include any suitable p-type semiconductor material, including cadmium telluride. Semiconductor absorber layer 130 can be deposited using any suitable deposition technique, including vapor transport. An intrinsic metal layer 140 can be deposited onto semiconductor absorber layer 130. Intrinsic metal layer 140 can include any intrinsic semiconductor material, including but not limited to molybdenum, aluminum, chromium, iron, nickel, titanium, vanadium, manganese, cobalt, zinc, ruthenium, tungsten, silver, gold, or platinum. Intrinsic metal layer 140 can also include a nitrogen. For example, intrinsic metal layer 140 can include a molybdenum nitride. Intrinsic metal layer 140 can be deposited using any suitable deposition technique, including sputtering, such as RF sputtering. Doped metal layer 150 can be deposited onto intrinsic metal layer 140 to serve as a back contact for photovoltaic device 10. Intrinsic metal layer 140 and/or doped metal layer 150 can also be of a suitable thickness, for example greater than about 10 Å, greater than about 20 Å, greater than about 50 Å, greater than about 100 Å, greater than about 250 Å, greater than about 500 Å, less than about 2000 Å, less than about 1500 Å, less than about 1000 Å, or less than about 750 Å. Doped metal layer 150 may include a metal base material and a dopant material. The metal base material can include any suitable metal or alloy, including molybdenum, aluminum, chromium, iron, nickel, titanium, vanadium, manganese, cobalt, zinc, ruthenium, tungsten, silver, gold, or platinum. The dopant material can include any suitable dopant, including copper, antimony, potassium, sodium, cesium, silver, gold, phosphorous, arsenic, or bismuth. For example, doped metal layer 150 can include a molybdenum, doped with about 0.1% to about 10% copper. Intrinsic metal layer 140 and/or doped metal layer 150 can be substantially pure, containing a single metal or a binary alloy, mixture, or solid solution thereof. Photovoltaic device 10 can undergo heat treatment, during which the dopant material from doped metal layer 150 can diffuse into intrinsic metal layer 140. For example, copper from a copper-doped molybdenum can diffuse into a molybdenum nitride layer to create a concentration gradient.

Referring to FIG. 2, photovoltaic device 10 can further include a barrier layer 200 deposited between substrate 100 and transparent conductive oxide 110. Barrier layer 200 can preserve and/or enhance device performance by prohibiting diffusion of sodium (or other chemicals) from substrate 100. Barrier layer 200 can include any suitable barrier material, including silicon nitride, aluminum-doped silicon nitride, silicon oxide, aluminum-doped silicon oxide, boron-doped silicon nitride, phosphorous-doped silicon nitride, silicon oxide-nitride, or tin oxide, or any combinations thereof. Barrier layer 200 can include multiple barrier layers. In continuing reference to FIG. 2, photovoltaic device can also include a buffer layer 210 to enable smooth and continuous deposition of the subsequent semiconductor window layer 120. Buffer layer 120 can include any suitable buffer material, including zinc tin oxide, tin oxide, zinc oxide, or zinc magnesium oxide. A back support 230 can be deposited onto doped contact layer 150, and can include any suitable material, for example, a soda-lime glass.

A variety of deposition techniques are available for depositing the layers discussed above, including for example, low pressure chemical vapor deposition, atmospheric pressure chemical vapor deposition, plasma-enhanced chemical vapor deposition, thermal chemical vapor deposition, DC or AC sputtering, spin-on deposition, and spray-pyrolysis.

A sputtering target can be manufactured by ingot metallurgy. A sputtering target can be manufactured from cadmium, tin, silicon, or alumium, or combinations or alloys thereof suitable to make the layer. For example, the target can be $Si_{85}Al_{15}$ The cadmium and tin can be present in the same target in stoichiometrically proper amounts. A sputtering target can be manufactured as a single piece in any suitable shape. A sputtering target can be a tube. A sputtering target can be manufactured by casting a metallic material into any suitable shape, such as a tube.

A sputtering target can be manufactured from more than one piece. A sputtering target can be manufactured from more than one piece of metal, for example, a piece of cadmium and a piece of tin. The cadmium and tin can be manufactured in any suitable shape, such as sleeves, and can be joined or connected in any suitable manner or configuration. For example, a piece of cadmium and a piece of tin can be welded together to form the sputtering target. One sleeve can be positioned within another sleeve.

A sputtering target can be manufactured by powder metallurgy. A sputtering target can be formed by consolidating metallic powder (e.g., cadmium or tin powder) to form the target. The metallic powder can be consolidated in any suitable process (e.g., pressing such as isostatic pressing) and in any suitable shape. The consolidating can occur at any suitable temperature. A sputtering target can be formed from metallic powder including more than one metal powder (e.g., cadmium and tin). More than one metallic powder can be present in stoichiometrically proper amounts.

A sputter target can be manufactured by positioning wire including target material adjacent to a base. For example wire including target material can be wrapped around a base tube. The wire can include multiple metals (e.g., cadmium and tin) present in stoichiometrically proper amounts. The base tube can be formed from a material that will not be sputtered. The wire can be pressed (e.g., by isostatic pressing).

A sputter target can be manufactured by spraying a target material onto a base. Metallic target material can be sprayed by any suitable spraying process, including thermal spraying and plasma spraying. The metallic target material can include multiple metals (e.g., cadmium and tin), present in stoichiometrically proper amounts. The base onto which the metallic target material is sprayed can be a tube.

Photovoltaic devices/cells fabricated using the methods discussed herein may be incorporated into one or more photovoltaic modules, each of which may include one or more submodules. Such modules may by incorporated into various systems for generating electricity. For example, a photovoltaic module may include one or more submodules consisting of multiple photovoltaic cells connected in series. One or more submodules may be connected in parallel via a shared cell to form a photovoltaic module.

A bus bar assembly may be attached to a contact surface of a photovoltaic module to enable connection to additional electrical components (e.g., one or more additional modules). For example, a first strip of double-sided tape may be distributed along a length of the module, and a first lead foil may be applied adjacent thereto. A second strip of double-sided tape (smaller than the first strip) may be applied adjacent to the first lead foil. A second lead foil may be applied adjacent to the second strip of double-sided tape. The tape and lead foils may be positioned such that at least one portion of the first lead foil is exposed, and at least one portion of the second lead foil is exposed. Following application of the tape and lead foils, a plurality of bus bars may be positioned along the contact region of the module. The bus bars may be positioned parallel from one another, at any suitable distance apart. For example, the plurality of bus bars may include at least one bus bar positioned on a portion of the first lead foil, and at least one bus bar positioned on a portion of the second lead foil. The bus bar, along with the portion of lead foil on which it has been applied, may define a positive or negative region. A roller may be used to create a loop in a section of the first or second lead foil. The loop may be threaded through the hole of a subsequently deposited back glass. The photovoltaic module may be connected to other electronic components, including, for example, one or more additional photovoltaic modules. For example, the photovoltaic module may be electrically connected to one or more additional photovoltaic modules to form a photovoltaic array.

The photovoltaic cells/modules/arrays may be included in a system for generating electricity. For example, a photovoltaic cell may be illuminated with a beam of light to generate a photocurrent. The photocurrent may be collected and converted from direct current (DC) to alternating current (AC) and distributed to a power grid. Light of any suitable wavelength may be directed at the cell to produce the photocurrent, including, for example, more than 400 nm, or less than 700 nm (e.g., ultraviolet light). Photocurrent generated from one photovoltaic cell may be combined with photocurrent generated from other photovoltaic cells. For example, the photovoltaic cells may be part of one or more photovoltaic modules in a photovoltaic array, from which the aggregate current may be harnessed and distributed.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method for manufacturing a photovoltaic device, the method comprising:

depositing an intrinsic metal layer on a semiconductor absorber layer; sputtering a doped metal contact layer on the intrinsic metal layer, the doped metal contact layer comprising a metal base material and a dopant material, wherein the metal base material is molybdenum, and wherein the dopant material is copper and the doped metal contact layer comprises a copper concentration of about 0.1% to about 10%; and forming a concentration gradient of the dopant material in the intrinsic metal layer by causing diffusion of at least some of the dopant material from the doped metal contact layer.

2. The method of claim 1, wherein depositing the intrinsic metal layer comprises sputtering a molybdenum nitride.

3. The method of claim 1, wherein depositing the intrinsic metal layer comprises depositing one selected from the group consisting of a molybdenum, aluminum, chromium, iron, nickel, titanium, vanadium, manganese, cobalt, zinc, ruthenium, tungsten, silver, gold, and platinum.

4. The method of claim 1, wherein the metal base material is selected from the group consisting of molybdenum, aluminum, chromium, iron, nickel, titanium, vanadium, manganese, cobalt, zinc, ruthenium, tungsten, silver, gold, and platinum; and wherein the dopant material is selected from the group consisting of copper, antimony, potassium, sodium, cesium, silver, gold, phosphorous, arsenic, and bismuth.

5. The method of claim 1, wherein sputtering the doped metal contact layer comprises sputtering a metal base material that comprises the same metal as the intrinsic metal layer.

6. A method for manufacturing a photovoltaic device, the method comprising:

depositing an intrinsic metal layer on a semiconductor absorber layer;

sputtering a doped metal contact layer on the intrinsic metal layer, the doped metal contact layer comprising a metal base material and a dopant material, wherein the metal base material is molybdenum and wherein the dopant material is copper and the doped metal contact layer comprises a copper concentration of about 0.1% to about 10%.

7. The method of claim 6, wherein depositing the intrinsic metal layer comprises sputtering a molybdenum nitride.

8. The method of claim 6, wherein depositing the intrinsic metal layer comprises depositing a metal selected from the group consisting of a molybdenum, aluminum, chromium, iron, nickel, titanium, vanadium, manganese, cobalt, zinc, ruthenium, tungsten, silver, gold, and platinum.

9. The method of claim 6, wherein depositing the doped metal contact layer comprises sputtering a metal base material that comprises the same metal as the intrinsic metal layer.

* * * * *